(12) United States Patent
Park et al.

(10) Patent No.: US 8,143,941 B2
(45) Date of Patent: Mar. 27, 2012

(54) ACTIVE ANALOG FILTER HAVING A MOS CAPACITOR DEVICE WITH IMPROVED LINEARITY

(75) Inventors: Sunghyun Park, Gilroy, CA (US); Xiaoyong Li, Santa Clara, CA (US); Tzu-wang Pan, Saratoga, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/617,428

(22) Filed: Nov. 12, 2009

(65) Prior Publication Data

US 2011/0109380 A1    May 12, 2011

(51) Int. Cl.
*H03K 5/00*    (2006.01)
(52) U.S. Cl. .................................. 327/553; 327/552
(58) Field of Classification Search .......... 327/551–559, 327/336–337, 362
See application file for complete search history.

(56) References Cited

U.S. PATENT DOCUMENTS

| | | | |
|---|---|---|---|
| 3,643,173 A * | 2/1972 | Whitten | 330/253 |
| 4,918,454 A | 4/1990 | Early et al. | |
| 5,801,411 A | 9/1998 | Klughart | |
| 6,700,149 B2 | 3/2004 | Tille et al. | |
| 6,876,255 B2 | 4/2005 | Reber | |
| 2002/0135044 A1 | 9/2002 | Tille et al. | |
| 2008/0149983 A1 | 6/2008 | Rassel et al. | |

FOREIGN PATENT DOCUMENTS

WO    WO9957671 A1    11/1999

OTHER PUBLICATIONS

W. Kraus, B. Stelzig, T. Tille, and D. Schmitt-Landsiedel, "MOS capacitances used in mixed-signal circuits and their operative range", Advances in Radio Science (2003) 1: 295-299.
Howard Chan, Zhongbo Chen, Sebastian Magierowski, and Krzysztof (Kris) Iniewski, "Parametric Conversion Using Custom-MOS Varactors", EURASIP Journal onWireless Communications and Networking, Article ID 12945, pp. 1-16, vol. 2006.
Neal R. Erickson, A Self-Biased Anti-parallel Planar Varactor Diode, Sixth International Symposium on Space Terahertz Technology, California Institute of Technology, Pasadena, CA, pp. 356-364, Mar. 1995.
Seong-Sik Song and Hyungcheol Shin, An RF Model of the Accumulation-Mode MOS Varactor Valid in Both Accumulation and Depletion Regions, IEEE Transactions on Electron Devices, vol. 50, No. 9, Sep. 2003.

(Continued)

*Primary Examiner* — Dinh T. Le
(74) *Attorney, Agent, or Firm* — Ramin Mobarhan

(57) ABSTRACT

An active analog filter (700, 1000) having a MOS capacitor device (730, 1030) with improved linearity is proposed. In an exemplary embodiment, dc bias voltage sources (755, 745) alter the capacitance of MOS varactors (740, 750) connected in anti parallel so that the total capacitance of the MOS capacitor device remains constant or within a range over the voltage range of the filter and the filter linearity is set. In a further exemplary embodiment the output stage (1070) of the operational amplifier circuit (1020) of the active analog filter (1000) is modified so that the dc bias voltage is provided by resistors (1055, 1045) connected to a current source (1060) already existing in the filter. Thus the linearity is set and the die area is significantly reduced.

23 Claims, 10 Drawing Sheets

OTHER PUBLICATIONS

F. Svelto, P. Erratico, S. Manzini, and R. Castello, "A Metal-Oxide-Semiconductor Varactor", IEEE Electron Device Letters, vol. 20, No. 4, Apr. 1999.

Hirokazu Yoshizawal, Gabor C. Temesl , Paul Ferguson Jr., and Francois Krummenacher, Novel Design Techniques for High-Linearity MOSFET-Only Switched-Capacitor, Symposium on VLSI Circuits Digest of Technical Papers, 1999.

Ghasemi R, et al., "Design of Low-Voltage MOSFET-Only Switched-Capacitor Filters", Microelectronics, 2005. ICM 2005. The 17th International Conference on Islamabad, Pakistan Dec. 13-15, 2005, Piscataway, NJ, USA, IEEE, Dec. 13, 2005, pp. 24-29, XP010890621.

International Search Report and Written Opinion—PCT/US2010/056615, International Search Authority—European Patent Office—Mar. 3, 201.

Ka-Fai Un, et al., "A DC-offset-compensated, CT/DT hybrid filter with process-insensitive cutoff and low in-band group-delay variation for WLAN receivers", Circuits and Systems, 2008. APCCAS 2008, IEEE Asia Pacific Conference on, IEEE, Piscataway, NJ, USA, Nov. 30, 2008, pp. 1360-1363, XP031405254.

Tille, T. et al., "Design of low-voltage MOSFET-only Sigma Delta modulators in standard digital CMOS technology", Circuits and Systems I: Regular Papers, IEEE Transactions on, Jan. 2004, pp. 96-109, vol. 51 Issue:1, XP011105427.

* cited by examiner

Accumulation mode (AMOS)

ACTIVE ANALOG FILTER HAVING A MOS CAPACITOR DEVICE WITH IMPROVED LINEARITY

TECHNICAL FIELD

The present disclosure relates to electronics and more particularly to active analog filters having a MOS capacitor device with improved linearity.

BACKGROUND

An active filter is a type of analog electronic filter distinguished by the use of one or more active components. An active low pass filter may be formed by connecting in parallel a feedback resistor across the respective input and output terminals of an operational amplifier. Additionally, a capacitor is connected in parallel to the feedback resistor.

Active analog filters used in RF devices are typically implemented on-chip. Often, capacitors occupy substantial portion of the die area compared to other components typically present in active analog filters. To minimize die area, it is desirable to make capacitor dimensions as small as possible. In state of the art highly integrated CMOS processes, strong design constraints exist that prevent area reduction of a circuit especially where passive components, such as capacitors, dominate the die area.

FIG. 1 shows an active analog filter 100 configured as a low pass filter. Active analog filter 100 includes operational amplifier 120, feedback resistor 110 and capacitor 130. Feedback resistor 110 is connected across operational amplifier 120 from the Vout output terminal to the Iin negative input terminal. Capacitor 130 is connected in parallel to feedback resistor $R_f$ 110. A corner frequency, $F_{-3dB}$ of the filter is set, in principle, by the product of the resistance ($R_f$) of resistor 110 times the capacitance ($C_f$) of capacitor 130 as shown in the following equation:

$$F-3\,\mathrm{dB} = \frac{1}{Cf * Rf} \qquad \text{Eq. (1)}$$

Either (i) Metal-Insulator-Metal (MIM) capacitors or (ii) Metal-Oxide-Semiconductor (MOS) capacitors may be used for the implementation of integrated active analog filters, especially for modern wireless telecommunication devices.

A MIM capacitor is a particular type of capacitor having two metal plates facing each other across capacitor dielectrics. MIM capacitors are known to exhibit high linearity over broad voltage ranges, low series resistance, small temperature coefficients of capacitance, low leakage currents, and sufficient dielectric reliability. MIM capacitors, however, are rather large compared, for example, to transistors or memory cells. Despite their relatively large size, MIM capacitors are typically preferred in cases where linear capacitance over voltage range is required.

MOS capacitors are preferable, in cases where circuit linearity is not critical, because they occupy less die area. In a typical 65 nm CMOS process, MOS capacitors require less than a quarter of the space that MIM capacitors require. A MOS capacitor is a well known type of capacitor device built on top of an n-well diffusion lying over a p substrate.

FIG. 2 shows a typical MOS varactor. MOS capacitors are often implemented as MOS varactors. Gate 210 and the two n+ contacts 220, 230 inside n-well 240 form two plates of capacitor. MOS varactors utilize both the depletion and accumulation operation regions of an MOS device thus offer higher capacitance per unit area as an NMOS channel is formed even when the potential between gate and source is zero.

One disadvantage of MOS capacitors, and equally MOS varactors, is poor capacitance linearity performance over voltage range. This is especially true in the presence of large signals across active analog filters.

A typical capacitance over voltage curve (C-V curve) of a MOS varactor may be modeled as '$\beta * \tan h(\alpha \cdot Vgs)$' where $\alpha$ and $\beta$ are parameters particular to the selected process technology. Vgs is the voltage across gate terminal 210, and source terminal 220, of MOS varactor 200, as illustrated in FIG. 2.

FIG. 3 shows a C-V curve 300 of a typical MOS varactor. C-V curve 300 is highly non-linear over its voltage operating range. As a result, MOS varactors are unfit for applications requiring high linearity, such as active analog filters. An active analog filter having a MOS capacitor device with improved linearity is desirable.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to an active analog filter having a MOS capacitor device with improved linearity performance.

Figure 1:
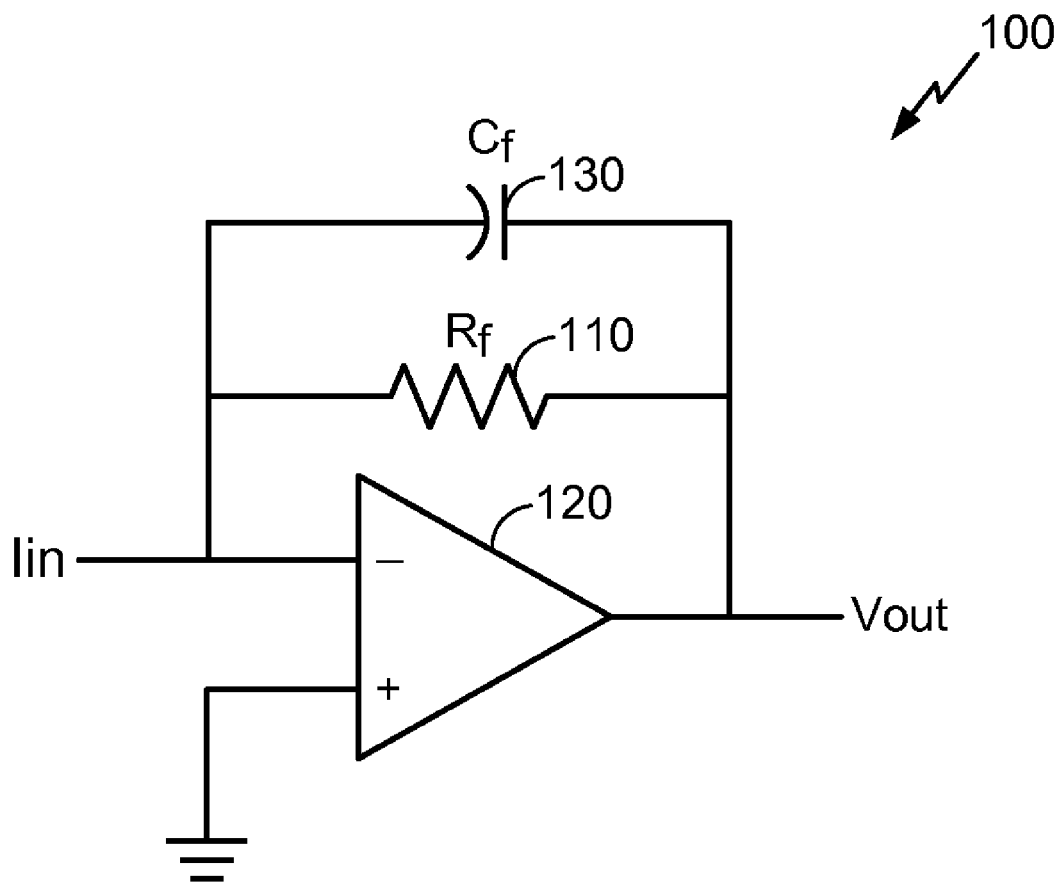
FIG. 1 shows an active analog filter configured as a low pass filter.
Figure 2:
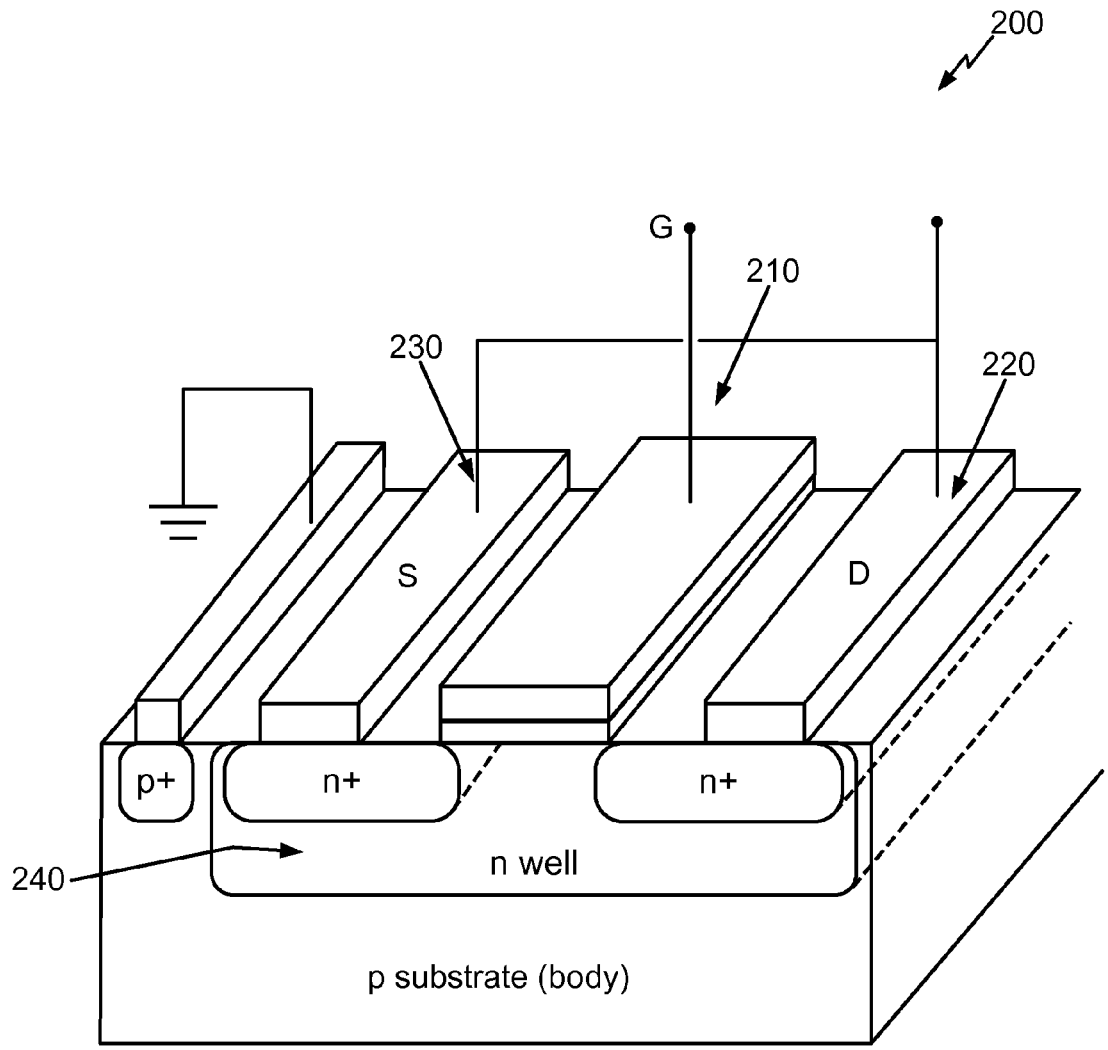
FIG. 2 shows a typical MOS varactor.
Figure 3:
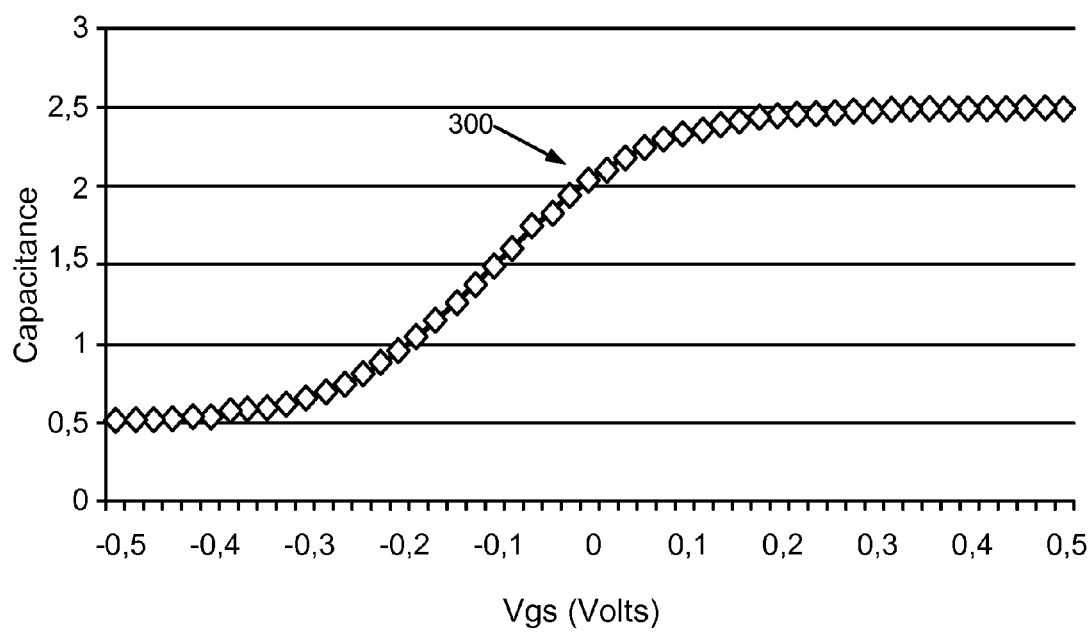
FIG. 3 shows a C-V curve of a typical MOS varactor.
Figure 4:
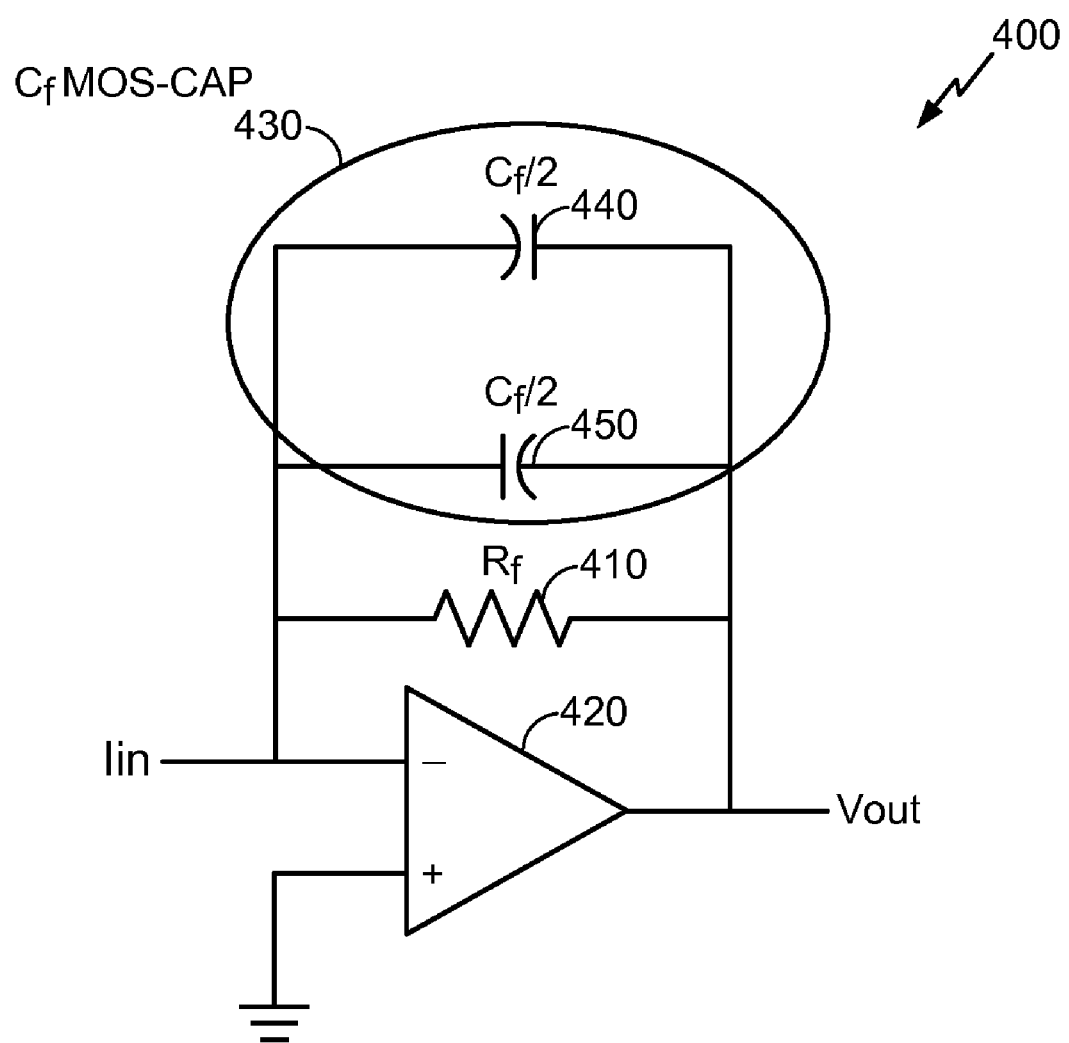
FIG. 4 shows a block diagram of an active analog filter with a MOS capacitor device having a structure that improves linearity.

FIG. 4 shows a block diagram of an active analog filter 400 with a MOS capacitor device 430 having a structure that improves linearity. The MOS capacitor device 430 comprises of two MOS varactors 440, 450 connected in anti-parallel, as shown in FIG. 4. Each MOS varactor 440, 450 has a capacitance ($C_f/2$) that is half the capacitance of capacitor 130 of FIG. 1. Thus, the overall capacitance of MOS capacitor device 430 is equal to the capacitance ($C_f$) of capacitor 130. The MOS capacitor device comprising of two MOS varactors in anti-parallel has improved linearity compares to a single MOS varactor.

Figure 5:
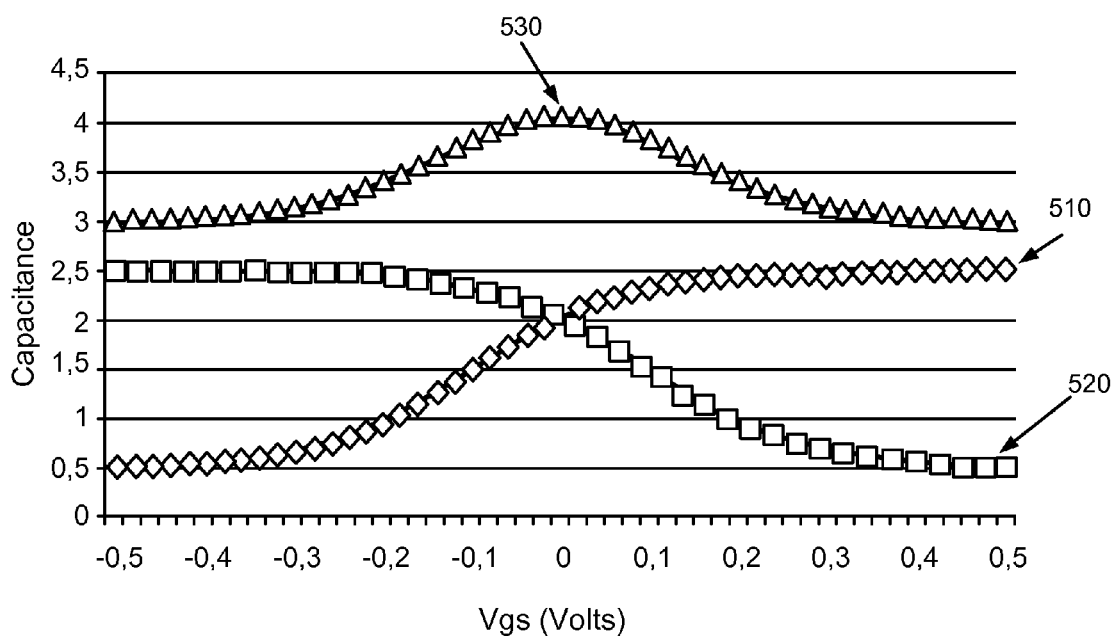
FIG. 5 shows the C-V curve of each MOS varactor and the total capacitance Cf of the MOS capacitor device of FIG. 4.

FIG. 5 shows the C-V curve of each MOS varactor 440, 450 and the total capacitance ($C_f$) of MOS capacitor device 430 of FIG. 4. As previously discussed, the capacitance of each MOS varactor 440, 450 can be approximately modeled by the function '$\beta*\tan h(\alpha \cdot Vgs)$', where $\alpha$ and $\beta$ are parameter determined by the fabrication process. The total capacitance ($C_f$) of the two MOS varactors 440, 450 connected in anti-parallel is therefore approximated as '$C_f=\beta*\tan h(\alpha \cdot VGS)+\beta*\tan h(-\alpha \cdot VGS)$'. The C-V curve of the total capacitance ($C_f$) is shown as the top C-V curve 530 in FIG. 5. The C-V curve 530 is more linear than the C-V curve 510, 520 of a single MOS varactor. However, the C-V curve 530 of the total capacitance ($C_f$) is still less linear compared to the MIM capacitor C-V curve.

Figure 6:
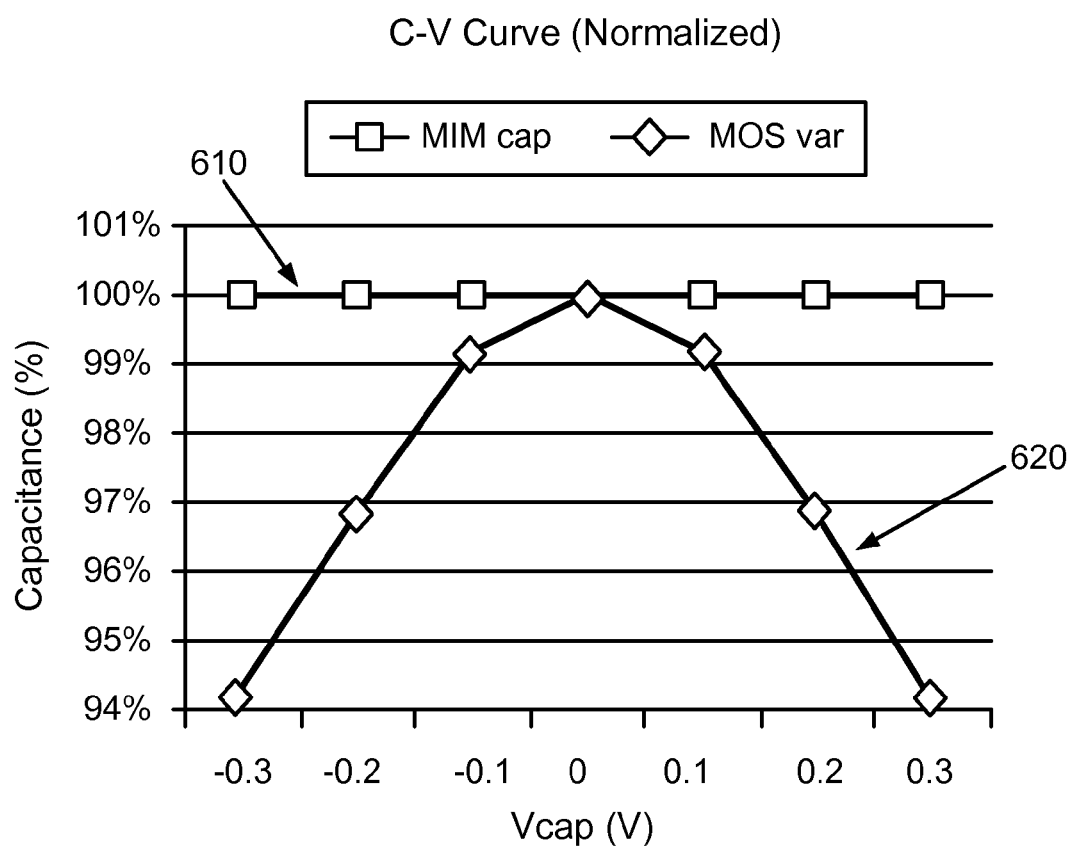
FIG. 6 shows the C-V curve for a MIM capacitor and the C-V curve for the MOS capacitor device of FIG. 4.

FIG. 6 shows C-V curve 610 for a MIM capacitor and C-V curve 620 for MOS capacitor device 430 of FIG. 4. When comparing the two C-V curves, there is a noticeable and rather significant curvature in C-V curve 620 of MOS capacitor device 430 compared to the totally linear performance of the MIM capacitor. As an example, the capacitance of MOS capacitor device 430 varies by 6% when the active analog filter 400 output voltage swing reaches 0.6 Volts peak to peak (Vpp), compared to 0 Vpp output level. The filter response is a function of the capacitance. As a result, the filter response of an active analog filter having MOS capacitor device 430, will be undesirably different in the presence of a large signal. This is a critical point in modern receivers, which are required to maintain linearity even in the presence of large interference signals, otherwise called "jammer signals". Receiver integrated analog filters are responsible for filtering out the jammer signal. It is desirable to maintain the same performance and linearity regardless of the amplitude of the jammer signal at the input of the filter.

Figure 7:
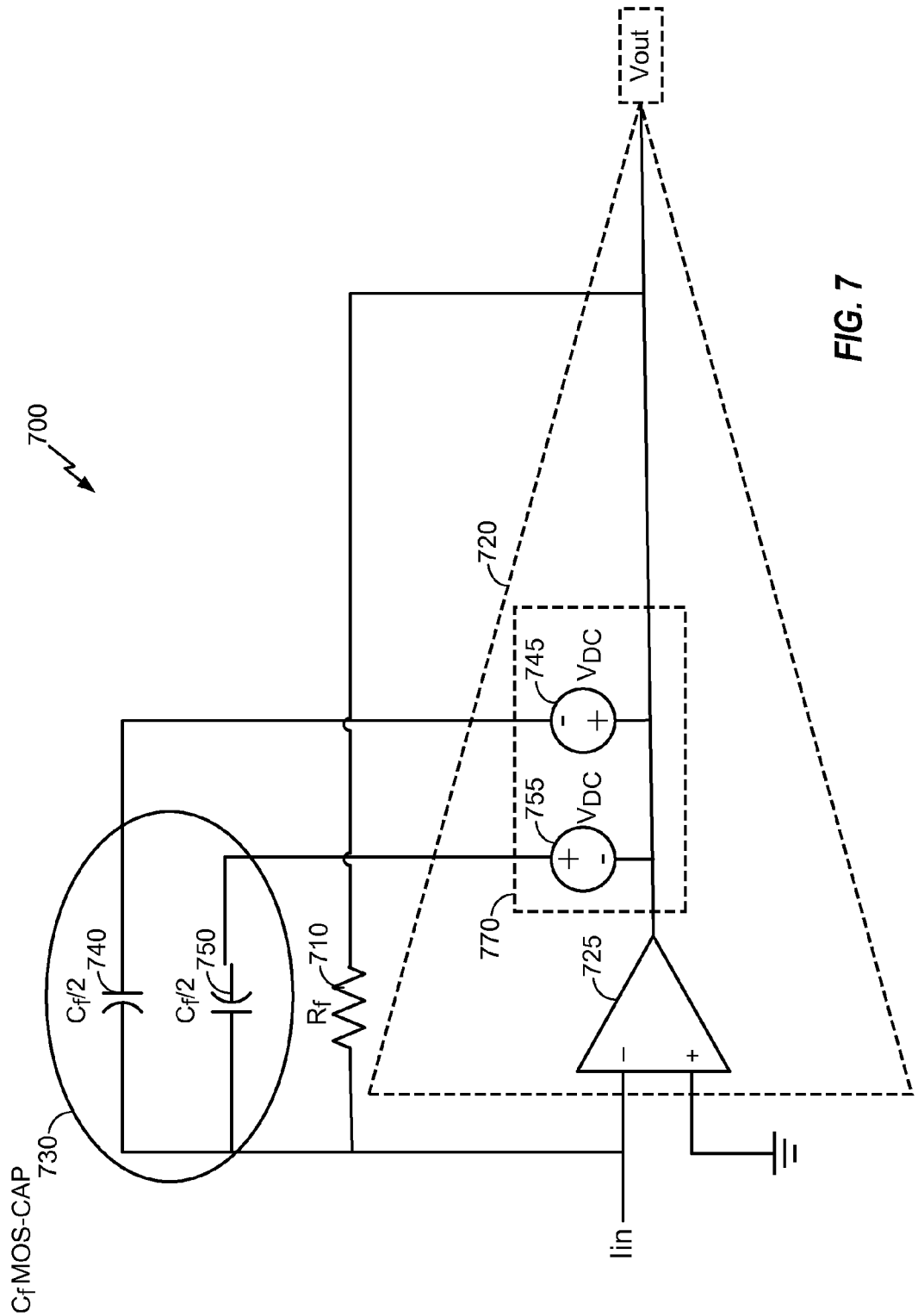
FIG. 7 is a block level diagram of an active analog filter having a MOS capacitor device with improved linearity, according to an exemplary embodiment.

FIG. 7 is a block level diagram of an active analog filter 700 having a MOS capacitor device 730 with improved linearity, according to an exemplary embodiment. The MOS capacitor device 730 is configured as a structure having two MOS varactors 740, 750 connected in anti parallel. Active analog filter 700 further comprises operational amplifier circuit 720. Operational amplifier circuit 720 includes a first stage 725 and an output stage 770. Output stage 770 comprises two dc biasing voltage sources 745, 755. First dc biasing voltage source 745 is coupled to first MOS varactor 740. Polarity and value of the first dc bias voltage source 745 is appropriately selected to offset the C-V curve of the MOS varactor 740. In a similar fashion, second dc bias voltage source 755 is connected to second MOS varactor 750. Accordingly, polarity and value of the second dc bias voltage source 755 is appropriately selected to offset the C-V curve of the MOS varactor 750.

Each dc bias voltage source 745, 755 provides voltage equal to Vdc to each MOS varactor 740, 750, respectively. However, each dc biasing voltage source 745. 755 is connected to each MOS varactor 740, 750, respectively, in reverse polarity. This way, the C-V curves of MOS varactors 740, 750 are shifted in opposite direction by the capacitance amount corresponding to the dc bias voltage applied to each MOS varactor 740, 750.

Figure 8:
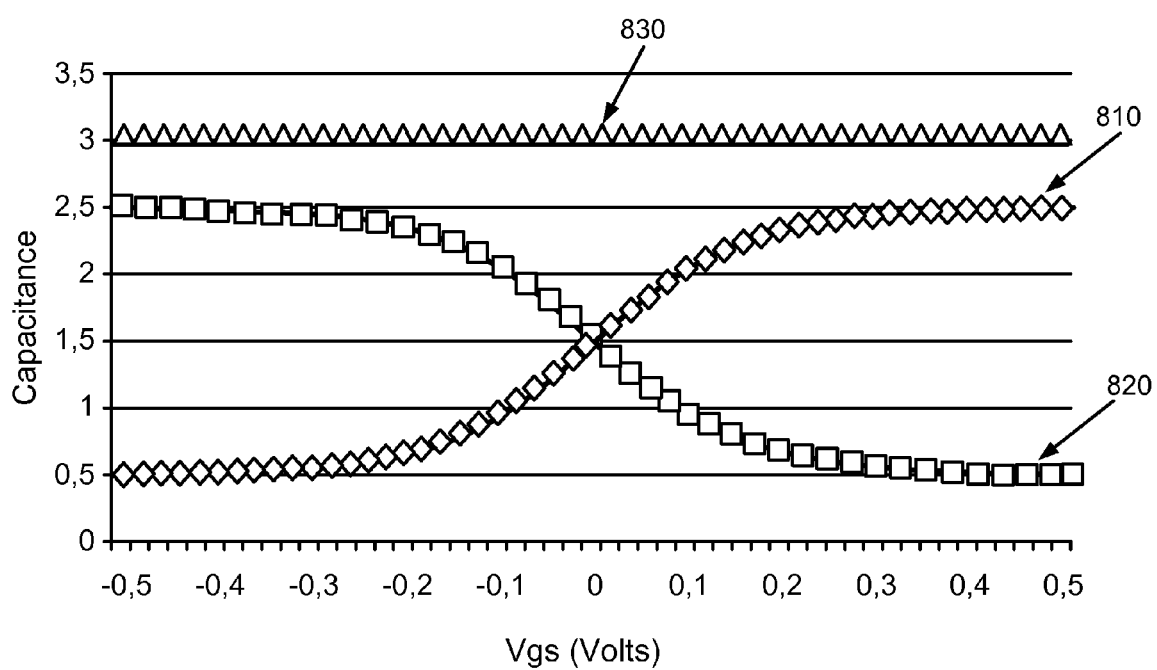
FIG. 8 shows the C-V curves shifted by Vdc, of the MOS varactors of the MOS capacitor device of FIG. 7 and the resulting C-V curve of the total capacitance (Cf).

FIG. 8 shows the C-V curves 810, 820, shifted by Vdc, of the MOS varactors 740, 750 of the MOS capacitor device 730 of FIG. 7 and the resulting C-V curve 830 of the total capacitance (Ctot). The combination of MOS capacitor device 730 with dc bias voltage sources 745, 755 achieves significantly improved linearity over MOS capacitor device 430 of FIG. 4.

Figure 9:
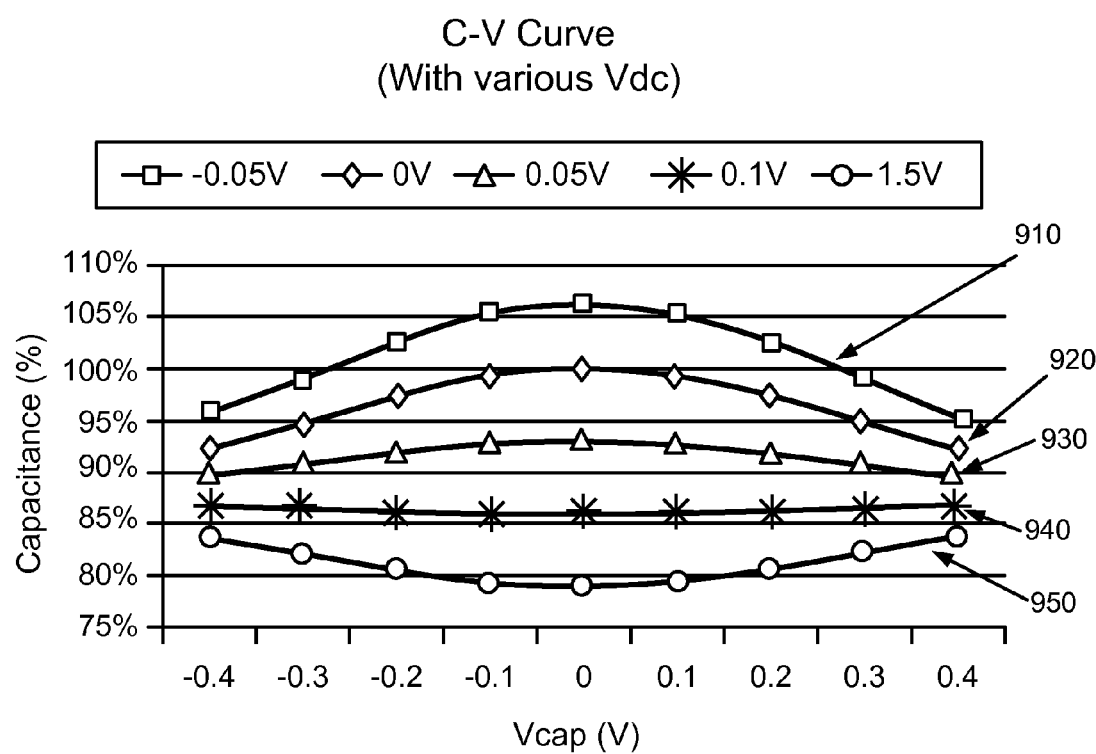
FIG. 9 shows several C-V curves at different levels of Vdc.

FIG. 9 shows several C-V curves 910, 920, 930, 940, 950 at different levels of Vdc. As an example, C-V curve 940 becomes noticeably linear when Vdc equals 0.1V compared to the C-V curve 920 when Vdc equals 0V. It is obvious that Vdc=0V corresponds to the C-V curve when the dc biasing voltage sources are not present in the filter.

In the example presented the total capacitance varies only by 0.7% when the filter output voltage swing reaches 0.6 Vpp compared to 0 Vpp output level. This is indicative of the fact that active analog filter linearity, which is a function of the capacitance, will now be sufficiently linear in the presence of a large signal. This will benefit modern receivers by maintaining their linearity even in the presence of "jammer signals".

The filter shown in FIG. 7 meets the linearity objective. It would be greatly beneficial to have an active analog filter with a MOS capacitor device having a structure with improved linearity using a simpler biasing scheme requiring less die area. A simpler biasing scheme can use circuit elements already existing in a filter or it can use a slightly modified filter structure.

Figure 10:
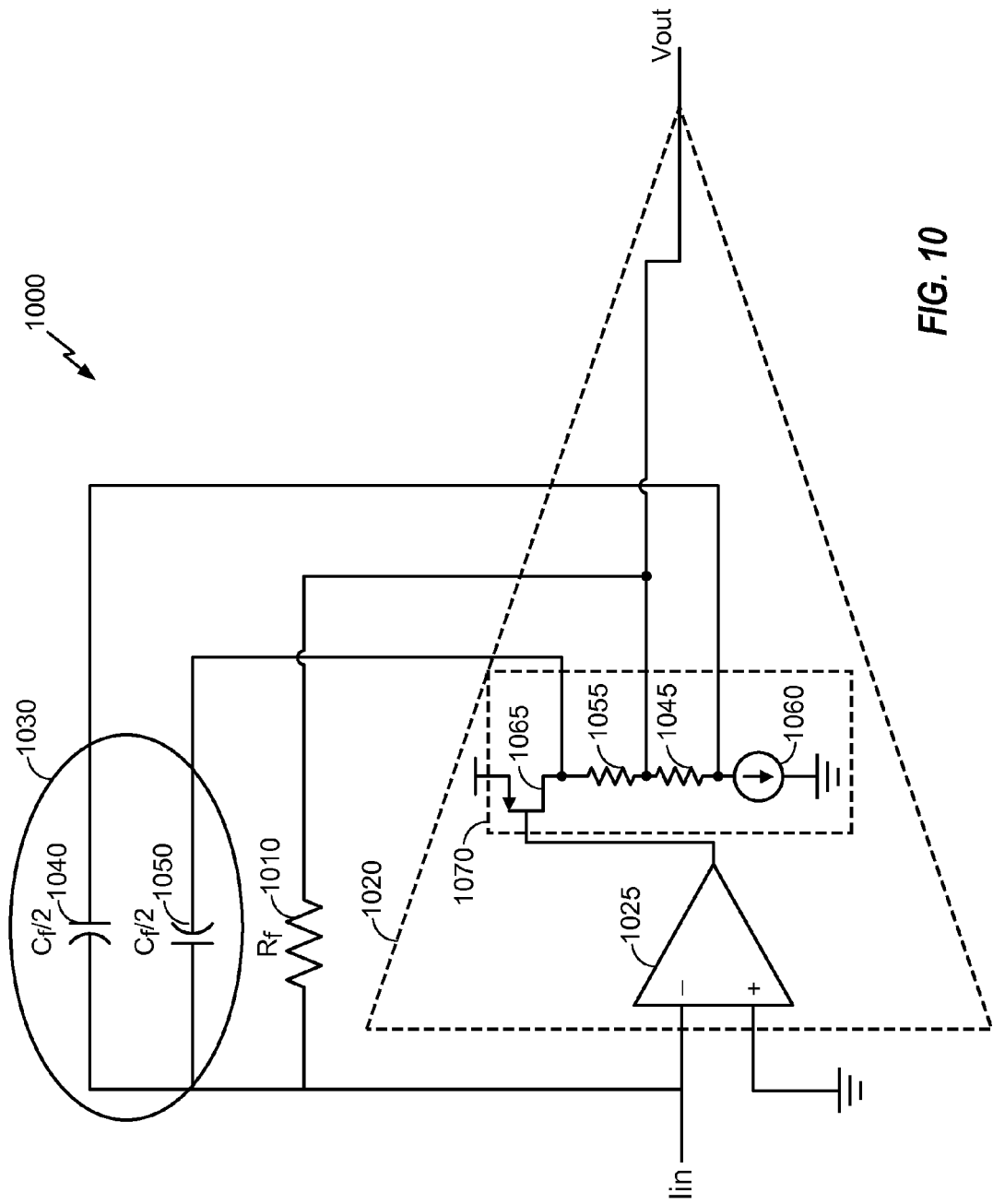
FIG. 10 shows a block level diagram of an active analog filter including a MOS capacitor device having a structure for improved linearity, according to another exemplary embodiment.

FIG. 10 shows a block level diagram of an active analog filter 1000 including a MOS capacitor device having a structure for improved linearity, according to another exemplary embodiment. Active analog filter 1000 includes MOS capacitor device 1030 comprising of two MOS varactors 1040, 1050 connected in anti parallel. Output stage 1070 of operational amplifier circuit 1020 is configured to bias each of the two MOS varactors 1040, 1050. In this embodiment, dc bias voltage (Vdc) is achieved by simply introducing two resistors 1045, 1055 to the output stage 1070 of operational amplifier 1020. More specifically, current source (Idc) 1060 and two fixed resistors 1045, 1055 of equal resistance (Rdc) implement the required bias voltage (Vdc). Current source (Idc) 1060 is coupled at one end to ground and at the other end to one end of the first fixed resistor (Rdc) 1045 and to MOS varactor 1040. The other end of first resistor (Rdc) 1045 is coupled at one end to second resistor (Rdc) 1055 and to feedback resistor 1010. The other end of second resistor (Rdc) 1055 is coupled to a drain of pFET transistor 1065 and to MOS varactor 1050. The source of pFET transistor 1065 is coupled to a power supply and a gate of pFET transistor 1065 is coupled to the output terminal of the first stage 1025 of the operational amplifier circuit 1020.

It should be appreciated by one skilled in the art that output stage 1070 of operational amplifier circuit 1020 may be replaced by an equivalent output stage that comprises a current source coupled to a power supply, and an nFET having a gate coupled to first stage 1025 of operational amplifier circuit 1020. In this output stage configuration, device order from power supply to ground would be current source, resistor, resistor, and nFET.

The implementation of FIG. 10 seamlessly integrates the biasing of the MOS varactors 1040, 1050 as part of operational amplifier circuit 1020 output stage 1070, without altering the function of output stage 1070. It should be noted that current sources are typically part of the output stage of operational amplifiers.

Therefore, this implementation achieves simultaneously the goal of improving the linearity of the filter and the goal of using a simpler biasing scheme requiring less die area.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An active analog filter comprising:
    a Metal Oxide Semiconductor (MOS) capacitor device, wherein the MOS capacitor device comprises a first MOS varactor and a second MOS varactor connected in anti parallel; and
    an operational amplifier circuit where an output stage of the operational amplifier circuit is configured to bias the MOS capacitor device to set the linearity of the active analog filter,
    where the Methal Oxide Semiconductor capacitor device is coupled between an input of the operational amplifier and the output stage and the output stage of the operational amplifier circuit includes:
    a first dc bias voltage source coupled to the first MOS varactor; and
    a second dc bias voltage source coupled to the second MOS varactor.

2. The active analog filter of claim 1, where the first and second dc bias voltage sources are of equal voltage but the first dc biasing voltage source is coupled to the first MOS varactor in reverse polarity relative to the polarity of the second dc bias voltage source coupled to the second MOS varactor.

3. The active analog filter of claim 2, where each of the first and second dc bias voltage sources alter the capacitance of each of the first and second MOS varactors, respectively so that the total capacitance of the MOS capacitor device remains constant over an output voltage range of the active analog filter.

4. An active analog filter comprising:
   a Metal Oxide Semiconductor (MOS) capacitor device, wherein the MOS capacitor device comprises a first MOS varactor and a second MOS varactor connected in anti parallel; and
   an operational amplifier circuit, where an output stage of the operational amplifier circuit is configured to bias the MOS capacitor device to set the linearity of the active analog filter, where the output stage comprises a transistor, a first resistor, a second resistor and a current source and where,
   the current source is coupled at one end to one end of the first resistor and to the first MOS varactor,
   the other end of the first resistor is coupled at one end of the second resistor and to the feedback resistor,
   the other end of the second resistor is connected to a drain of the transistor and to the second MOS varactor, and
   a gate of the transistor is coupled to the output of the first stage of the operational amplifier.

5. The active analog filter of claim 4, where the first resistor and the second resistor have the same resistance value.

6. The active analog filter of claim 5, where the voltage across the first resistor and the voltage across the second resistor alter the capacitance of each of the first and second MOS varactors, respectively, so that a total capacitance of the MOS capacitor device remains constant over an output voltage range of the active analog filter.

7. The active analog filter of claim 4, where,
   the current source is coupled at the other end to ground; and
   the source of the transistor is coupled to a voltage source.

8. The active analog filter of claim 7, where,
   the current source is coupled at the other end to a voltage source; and
   the source of the transistor is coupled to ground.

9. An active analog filter comprising:
   a capacitor device, where the capacitor device includes a first MOS varactor and a second MOS varactor connected in anti parallel; and
   means for amplifying an input signal having an output stage configured to bias the capacitor device to set the linearity of the active analog filter, where the capacitor device is coupled between an input of the means for amplifying and the output stage and the output stage includes a first dc bias voltage source coupled to the first MOS varactor and a second dc bias voltage source coupled to the second MOS varactor.

10. The active analog filter of claim 9, where the dc bias voltage sources are of equal voltage but the first dc bias voltage source is coupled to the first MOS varactor in reverse polarity relative to the polarity of the second dc bias voltage source coupled to the second MOS varactor.

11. The active analog filter of claim 10, where each of the dc bias voltage sources alter the capacitance of each of the first and second MOS varactors, respectively, so that a total capacitance of the capacitor device remains constant over an output voltage range of the active analog filter.

12. An active analog filter comprising:
   a capacitor device, where the capacitor device includes a first MOS varactor and a second MOS varactor connected in anti parallel; and
   means for amplifying an input signal having an output stage configured to bias the capacitor device to set the linearity of the active analog filter, where the capacitor device is coupled between an input of the means for amplifying and the output stage the output stage comprises a transistor, a first resistor, a second resistor and a current source and where,
   the current source is coupled at one end to one end of the first resistor and to the first MOS varactor,
   the other end of the first resistor is coupled at one end of the second resistor and to the feedback resistor,
   the other end of the second resistor is connected to a drain of the transistor and to the second MOS varactor, and
   a gate of the transistor is coupled to the output of the means for amplifying.

13. The active analog filter of claim 12, where the first resistor and the second resistor have the same resistance value.

14. The active analog filter of claim 13, where a voltage across the first resistor and a voltage across the second resistor alter the capacitance of each of the MOS varactors, respectively, so that a total capacitance of the capacitor device remains constant over an output range of the active analog filter.

15. The active analog filter of claim 12, where,
   the current source is coupled at the other end to ground; and
   the source of the transistor is coupled to a voltage source.

16. The active analog filter of claim 12, where,
   the current source is coupled at the other end to a voltage source; and
   the source of the transistor is coupled to ground.

17. An integrated circuit including an active analog filter comprising
   a MOS capacitor device, where the MOS capacitor device includes a first MOS varactor and a second MOS varactor connected in anti parallel; and
   an operational amplifier circuit where an output stage of the operational amplifier circuit is configured to bias the MOS capacitor device to set the linearity of the active analog filter, where the MOS capacitor device is coupled between an input of the operational amplifier and the output stage the output stage of the operational amplifier circuit includes a first dc bias voltage source coupled to the first MOS varactor and a second dc bias voltage source coupled to the second MOS varactor.

18. The integrated circuit of claim 17, wherein:
   the first and second dc bias voltage sources are of equal voltage, with the first dc bias voltage source being coupled to the first MOS varactor in reverse polarity relative to the polarity of the second dc bias voltage source coupled to the second MOS varactor; and
   each of the first and second dc bias voltage sources are coupled to alter the capacitance of each of the MOS varactors, respectively, so that a total capacitance of the MOS capacitor device remains constant over an output of the active analog filter.

19. An integrated circuit including an active analog filter comprising
   a MOS capacitor device, where the MOS capacitor device includes a first MOS varactor and a second MOS varactor connected in anti parallel; and
   an operational amplifier circuit where an output stage of the operational amplifier circuit is configured to bias the MOS capacitor device to set the linearity of the active analog filter, wherein the MOS capacitor device so coupled between an input of the operational amplifier and the output stage
   the output stage comprises a transistor, a first resistor, a second resistor of equal value to the first resistor, and a current source, the current source is coupled at one end to one end of the first resistor and to the first MOS varactor, the other end of the first resistor is coupled at one end of the second resistor and to the feedback resistor, the other end of the second resistor is connected to a drain of the transistor and to the second MOS varactor, and a gate of the transistor is coupled to the output of the first stage of the operational amplifier circuit.

20. The integrated circuit of claim 19, where a voltage across the first resistor and a voltage across the second resistor alter the capacitance of each of the MOS varactors, respectively, so that a total capacitance of the MOS capacitor device remains constant over an output range of the active analog filter.

21. The integrated circuit of claim 19, where, the current source is coupled at the other end to ground; and the source of the transistor is coupled to a voltage source.

22. The integrated circuit of claim 19, where, the current source is coupled at the other end to a voltage source; and the source of the transistor is coupled to ground.

23. A wireless communication device including an active analog filter comprising:

a MOS capacitor device, where the MOS capacitor device includes a first MOS varactor and a second MOS varactor connected in anti parallel; and an operational amplifier circuit where an output stage of the operational amplifier circuit is configured to bias the MOS capacitor device to set the linearity of the active analog filter, wherein the MOS capacitor device is coupled between an input of the operational amplifier and the output stage the output stage of the operational amplifier circuit includes:

a first dc bias voltage source coupled to the first MOS varactor; and a second dc bias voltage source coupled to the second MOS varactor.

* * * * *